United States Patent [19]

Henry et al.

[11] Patent Number: 4,513,395

[45] Date of Patent: Apr. 23, 1985

[54] APPARATUS AND METHOD FOR ACQUIRING MULTIPLE GROUPS OF DATA SIGNALS FROM A SYNCHRONOUS LOGIC SYSTEM

[75] Inventors: Michael D. Henry, Portland; Bruce J. Ableidinger, Beaverton; Nirmal K. Agarwal, Portland, all of Oreg.

[73] Assignee: Northwest Instrument Systems, Inc., Beaverton, Oreg.

[21] Appl. No.: 479,089

[22] Filed: Mar. 25, 1983

[51] Int. Cl.³ .............................................. G06F 1/00
[52] U.S. Cl. ................................................... 364/900
[58] Field of Search ... 364/200 MS File, 900 MS File

[56] References Cited

U.S. PATENT DOCUMENTS 4,040,025  8/1977  Morrill, Jr. et al. ............... 364/900
4,139,903  2/1979  Morrill, Jr. et al. ............... 364/900
4,241,416  12/1980  Tarczy-Hornoch ............... 364/900

OTHER PUBLICATIONS

"P1540 Logic Analysis System Operator's Manual", Paratronics, 1980, pp. 3-1 to 3-6 and 7-1 to 7-8.
"Logic Analyzer PM 3551", Philips.

*Primary Examiner*—Raulfe B. Zache
*Attorney, Agent, or Firm*—Chernoff, Vilhauer, McClung, Birdwell & Stenzel

[57] ABSTRACT

An apparatus and method which may be used with a logic analyzer are provided for acquiring groups of data words from the circuitry of a synchronous logic system where each group contains a qualified data word together with a predetermined number of data words which have preceded it. The apparatus includes a circuit for detecting the qualified word and a data storage device having a plurality of separately-addressable storage locations. Both the qualified data detector and the storage device are logically connected to the synchronous logic circuitry. The apparatus further includes an addressing circuit which responds to the detection of a qualified word and to the presence of data words on the synchronous logic circuitry by producing storage addresses which are provided to the storage device for storing the data word groups in successive storage locations. In an alternative embodiment, the addressing means responds to qualified word detection and to the number of data words stored in the storage locations such that each stored group of data words contains a qualified word and a respective number of data words.

16 Claims, 7 Drawing Figures

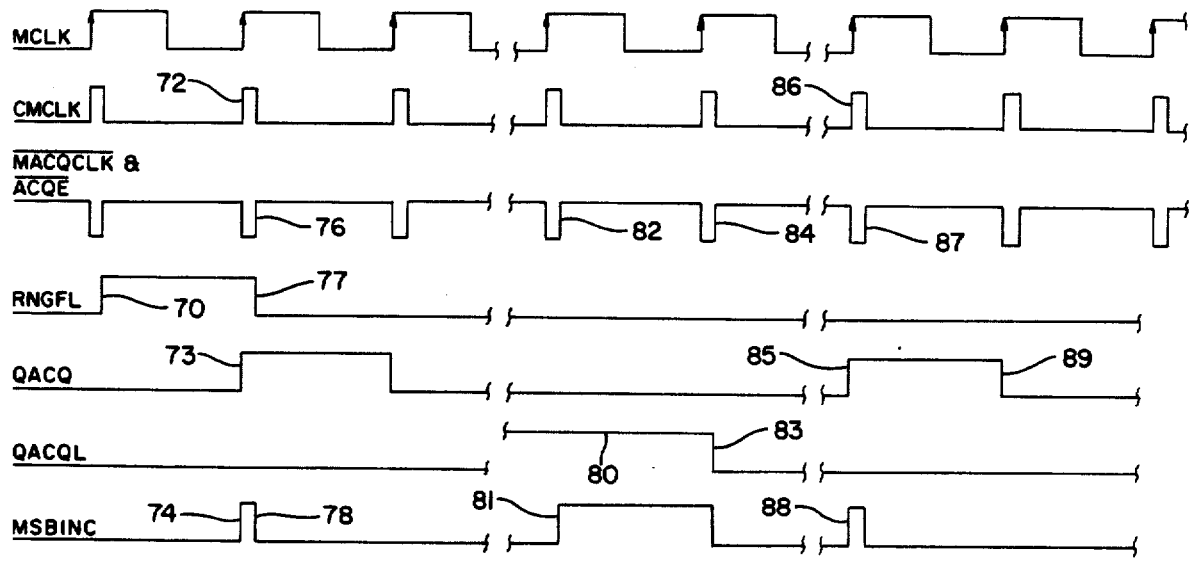

APPARATUS AND METHOD FOR ACQUIRING MULTIPLE GROUPS OF DATA SIGNALS FROM A SYNCHRONOUS LOGIC SYSTEM

BACKGROUND OF THE INVENTION

This invention relates to equipment for monitoring synchronous digital logic systems, particularly to logic analyzers having the ability to monitor and selectively acquire data from a synchronous computer system which is undergoing testing.

The field of computer testing equipment includes the use of logic analyzers to assist in the analysis of computer system malfunctions. In the performance of this function, an analyzer is connected to the synchronous logic circuitry of a system under test where it can monitor the status of system hardware and software by observing the operation of the aforementioned circuitry. Normally such circuitry includes, separately or in combination, the address, data, or control busses of the system, circuitry associated with the busses, or the computer itself. Logic analyzers of this type are well-known, the P1540 logic analysis system manufactured by Paratronics, Inc., San Jose, Calif. being an example.

As is well understood by those skilled in the art, one important feature of a logic analyzer is its ability to capture data from the system under test and to present it in a form which provides a representation of the operation of the system under test. The sophisticated structure of present day microprocessor systems demands that the capability of monitoring this flow of information augmented by an ability to focus this view around a specific area of processor code or a sequence of words or events. Consequently, a desirable logic analyzer feature is the ability to trap or trace data around a very specific system event.

In practical terms, this trapping feature is implemented by providing a logic analyzer with a word recognition ability and designing it to react to word recognition in a variety of ways. For example, Tarczy-Hornoch U.S. Pat. No. 4,241,416 describes an analyzer which can capture and display data which precedes or follows the occurrence of a recognized data word. This is extremely useful for debugging software routines because it provides the user with the ability to view program activity immediately before or after a system cycle of interest. For example, a system malfunction may be characterized by the sporadic production from an I/O port of data whose value is not known, but which is suspected to be incorrect. In this case the activity of the port, which is irregular, is required to be monitored, preferably by identification of the port's address. The Tarczy-Hornoch analyzer has the ability to recognize the I/O port address and display a selected number of system cycles which precede that address. This enables the user to inspect the opcodes and their associated addresses occurring before the I/O cycle of interest to determine whether a valid command preceded it. However, this analyzer only has the capability of holding one set of captured data at a time; a subsequent capture will cancel a previous the capture. Hence, the user must interact with the system under test by stepping through its program, segment by segment, until the incorrect opcode address is discovered.

Another problem with a logic analyzer which can capture and hold only one group of data bus words at a time is that the user must spend his time setting it up to respond to the precise point in a software program where the processor system malfunctions. In the example cited above where the I/O activity may occur repeatedly throughout the program without every occurrence representing a malfunction, a design engineer can consume a significant amount of time in configuring the analyzer to respond to only the pathological occurrence.

It is therefore desirable to provide a logic analyzer with the ability to acquire a plurality of groups of data from a system under test, with each group containing a particular data cycle and the data occurring just before and contiguous with the cycle of interest. The acquisition of such groups during the course of the program will provide a system designer with a powerful tool for analyzing software execution with as few as one complete and uninterrupted runthrough of the program.

Logic analyzers which can store a plurality of data groups are known, an example being the PM 3551 logic analyzer manufactured by Philips Gloeilampenfabrieken N.V., Eindhoven, Netherlands. However, the data word groups acquired by the Philips analyzer include data which occurs after, rather than before, the data cycle on which capture is keyed. This does permit the analyzer to key data group capture upon a data word which stimulates a word of interest. However, in order to accumulate all occurrences of the word, the user must know every possible opcode which can call or stimulate it. Therefore, not only must the designer know all possible stimuli of a data cycle, but the logic analyzer must have the ability to recognize and react to all of them simultaneously. It is evident that, for this type of logic analyzer, as the number of cycles of interest increases, so too, and at a higher rate, does the number of stimulus words which must be identified and stored. Thus, where a user may wish to analyze system activity around more than one cycle of interest, the logic analyzer must have a significant capacity for recognizing the stimulus signals.

Therefore, it is desirable to provide a logic analyzer with the ability to store a plurality of groups of signals, with each group containing a data word of interest and a number of words which precede it on a data bus. This feature will eliminate the tedious operation and the limitation of single-shot acquisition of analyzers represented by the Tarczy-Hornoch device and reduce the user time required for their operation, while at the same time eliminating the word recognition limitations imposed by the Phillips-type analyzer.

SUMMARY OF THE INVENTION

The present invention overcomes the aforementioned drawbacks of prior-art logic analyzers through a storage memory architecture offering the ability to acquire a plurality of groups of data signals acquired from a synchronous logic system, where each group includes a data word of interest together with a number of data words which precede, rather than follow it. This capability results from the provision of an apparatus for establishing the storage memory addresses of each data group, such that no more than a predetermined number of successive data words preceding a data word of interest are stored, together with the word of interest, in data storage locations corresponding to those addresses.

As is understood by the those skilled in the art, a logic analyzer includes detection circuitry which observes logic circuitry activity in order to identify a specified word or words. Upon detection, which is also called "qualification", the circuitry provides an "acquisition" signal, which may be used to trigger other function or strobe other circuitry in the analyzer. As a result of this identification technique, an analyzer can begin to count, latch, or change state upon the concurrence of the acquisition signal and a system clock pulse. The Tarczy-Hornoch and Phillips devices referenced hereinabove possess this capability.

In accordance with the apparatus of this invention, a qualified data detection circuit responds to the occurrence of a particular ("qualified") word or words in the circuitry of a system under test by producing an acquisition signal. The apparatus of the invention also includes a data storage memory having a plurality of storage locations and addresses corresponding with those locations, which is coupled to the data bus for storing a plurality of successive data signals. A novel addressing circuit, responsive to the acquisition signal provided by the word recognition circuitry and to the presence of data words on the data bus, produces the storage addresses for each set of successive data words such that a predetermined number of successive words which precede the qualified data word may be stored, together with that word, in data storage memory locations which correspond to the produced storage addresses.

The addressing apparatus of the invention includes a first counting circuit which is responsive to the acquisition signal to produce a first address pointer signal representative of a predetermined number of most significant bits of each storage address. The apparatus also includes a second counting circuit which is responsive to the presence of data words from the circuitry of the system under test for producing second pointer signal representative of a predetermined number of least significant bits of each storage address. In operation, successive data words are continuously written into the storage memory at locations addressed by a pointer signal combining the most significant bits produced by the first counting circuit and the least significant bits produced by the second counting circuit. Thus, the least significant bits of the address pointer are incremented once for every word on the data bus. The result is that words are written into a ring of storage address locations determined by the least significant bits. In one embodiment of the invention, when the acquisition signal occurs, the most significant bits increment, effectively causing the address pointer to increment by the maximum value represented by the least significant bits of the address pointer. This provides the apparatus with the ability to store the specified data word and a predetermined number of immediately preceding data words, while incrementing to a new set of memory locations to store the next group of data words. In another embodiment of the invention, the most significant bits increment when the acquisition signal coincides with the filling of the ring of address locations.

In addition, the invention provides a method for selectively storing, in a plurality of successive storage memory locations, a plurality of successive data words from the circuitry of the system under test, each storage location having a corresponding storage address. The method includes providing a predetermined number of most significant bits to form a first portion of each said address, and providing a predetermined number of least significant bits to form a second portion of each address. The value of the second portion of each address is changed in response to the presence of data words on the circuitry of the system under test and successive data words are stored at storage locations having addresses determined according to the combination of most significant bits and least significant bits. By changing the value of the first portion of the address in response to the presence of a qualified data word on the data bus, the method will permit the storage of a plurality of groups of data words, each containing at least one qualified data word together with a predetermined number of data words which preceded it.

In a second embodiment of the method, the first portion of the address is changed in response to the presence of a qualified data word and to the storage of a predetermined number of data words at said storage locations.

Accordingly, it is a principal objective of the present invention to provide an improved apparatus and method for selectively acquiring groups of data words from the system under test.

It is another principal objective of the present invention to provide such a method and apparatus which are particularly suitable for a logic analyzer to be used in monitoring and testing processor systems.

It is another principal objective of the present invention to provide such a method and apparatus for capturing and storing a plurality of data word groups, each of which includes a predetermined number of data words which precede a data word of interest.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 5 is an illustration of various timing and control waveforms necessary to the operation of the circuitry illustrated in FIGS. 4 and 6.

FIG. 7 illustrates how representative groups of data words are arranged in the data storage memory by the apparatus of the present invention.

DETAILED DESCRIPTION OF THE INVENTION

Figure 1:
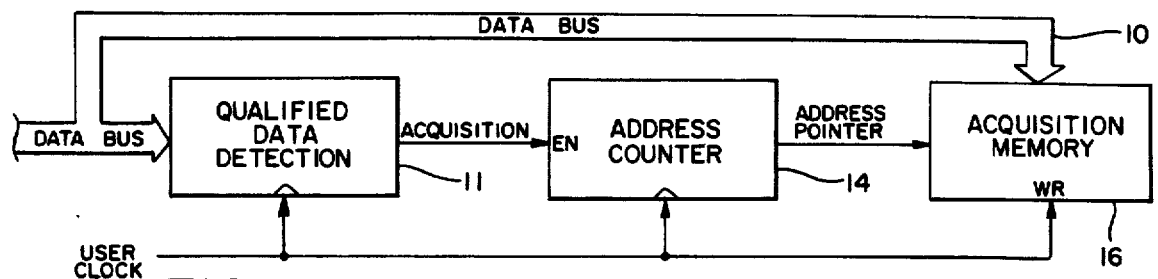
FIG. 1 presents a simplified block diagram of a data storage memory apparatus used in prior art logic analyzers to recognize and store particular data words which propagate on a data bus.

Referring to FIG. 1, an apparatus which is provided in a logic analyzer for acquiring data signals from a system under test is illustrated. As is understood by those skilled in the art, data signals of interest may be transferred between the elements of a tested computer system, not shown, on a system circuit, for example, on a bus 10. While a specific format of the data signals is not intended to be a limitation to any element described herein, it may be assumed for the sake of illustration that they comprise a parallel array of sixteen digital bits which, taken together, form a word. Further, it can be assumed that words are successively transmitted on the bus 10 in synchronism with a clock signal generated by the system under test.

In the FIG. 1 apparatus, a qualified data detection circuit 11 is provided which is coupled to the data bus 10 to monitor the flow of data words thereon. The circuit 11 contains a particular digital word or an array of digital words of interest to the user of the logic analyzer. The stored data words are referred to herein as "qualified" data words. When qualified data in the detection circuit 11 matches a data word on the bus 10, the circuit provides an output signal indicative of the event. Such circuits are well understood in the art, the matching circuit of the Tarczy-Hornoch patent cited hereinabove being one example.

The prior art storage apparatus of FIG. 1 further comprises an address pointer counter 14, the structure and function of which is well understood in the art. The apparatus also includes an acquisition memory 16 whose data input ports are connected to the data bus 10, and whose address ports are connected to the output of the address counter 14. In operation, the qualified data detection circuit 11 continuously monitors the activity on the data bus 10, providing an acquisition signal to the address counter 14 whenever a qualified word is detected. The acquisition signal, which lasts for one cycle of the clock signal generated by the system under test, allows the contents of the address counter 14 to be incremented by one during the clock cycle. The counter contents are provided as an address pointer signal to the acquisition memory 16. The result is that data words propagating on the data bus 10 are continuously written into the acquisition memory 16 at a storage location address which is incremented only if the qualified data detection circuit 11 determines that the incoming data meets the qualification requirements for storage. Hence, when the address pointer signal is incremented, the previous acquisition memory address contains the qualified data word.

Figure 2:
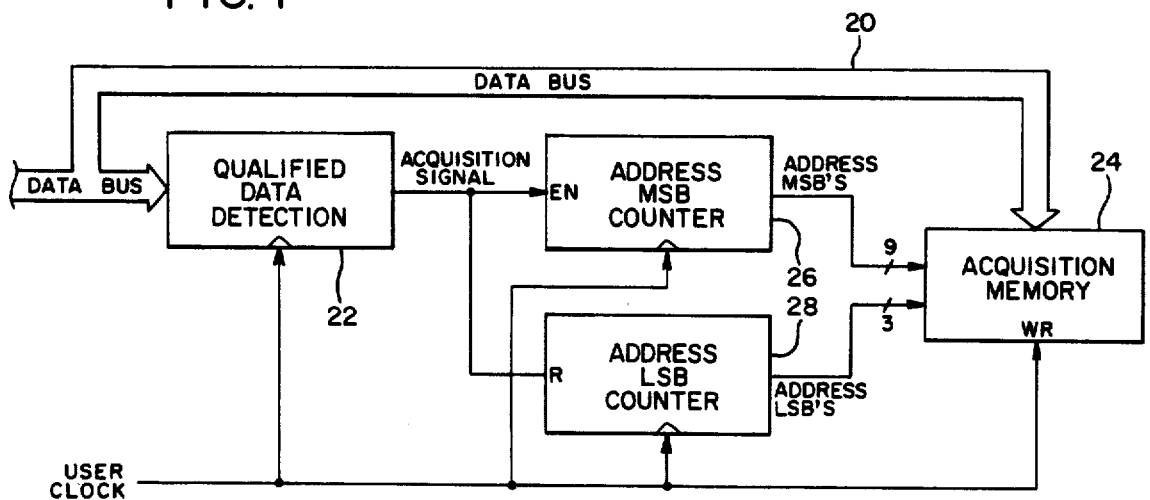
FIG. 2 is a simplified block diagram of a data storage memory apparatus of the type employing one embodiment of the present invention.

In the first embodiment of the invention, illustrated in FIG. 2, data words propagating on a data bus 20 are input to a qualified data detection circuit 22 and to the data input ports of an acquisition memory 24. Coupled between the qualified data detection circuit 22 and the acquisition memory 24 are a first counter 26, called the "address MSB counter," and a second counter 28, termed the "address LSB counter." The clock signal of the system under test, which is synchronous with the data words on the data bus 20, is provided on a signal line to the clock inputs of the address MSB counter 26 and the address LSB counter 28, and to the write enable input (WR) of the acquisition memory 24.

An acquisition signal, provided by the qualified data detection circuit 22 upon the detection of a qualified data word is carried to the enable input of the address MSB counter 26 and to the reset input of the address LSB counter 28. The contents of the counters 26 and 28 are provided, as an address pointer signal, to the address input terminals of the acquisition memory 24, with the MSB counter contents providing the most significant and the LSB counter the least significant bits of the addresses of storage locations in the memory.

In the embodiment of the invention illustrated in FIG. 2, the acquisition memory 24 comprises a random access memory (RAM) having whatever dimensions are required for the intended range of applications. For illustration only and without any limitation to the apparatus of the invention, it will be assumed that the acquisition memory 24 comprises a 24-bit-wide RAM having 4,096 memory locations. For further illustration, the MSB counter 26 provides the nine most significant bits, and the LSB counter 28 the three least significant bits, of the current acquisition memory location. The address LSB counter 28 is configured as a continuously cycling, eight-state ring counter whose count is incremented by the system clock.

In operation, the lower digit of the current address, represented by the three LSB's, is allowed to free run. That is, the counter 28 cyclically counts over a cycle of eight states, incrementing once for every system clock pulse. The upper digits, represented by the nine MSB's, are incremented whenever a qualified data word is detected on a data bus. Thus, instead of continuously writing over a single address (as in the prior-art apparatus illustrated in FIG. 1) data words on the data bus 20 are written continuously over a ring of eight addresses, due to the free running advancement of the lower order digit. Further, when a qualified word occurs, the LSB's are preset to 000, while the MSB's increment, effectively causing the address pointer to advance by eight to a new sector of acquisition memory comprising eight new data storage locations while the qualified word and up to seven words which preceded it are stored at the preceding eight locations.

Hence, the apparatus of FIG. 2 can capture groups of data which are characterized in that the words of a group always include a qualified data word together with up to a predetermined number of words, in this case seven, which preceded the qualified data word. Since the existing art provides qualified data detection circuits which can recognize more than one qualified data word, it should be evident that the apparatus of the invention can be provided with the ability to capture and retain a plurality of different data groups which are qualified by one or more different qualified data words.

It will be recognized by design engineers that the apparatus of the invention establishes a powerful tool for use in digital logic system development. To continue the I/O port example given hereinabove, if the engineer should establish the I/O port address as a qualified data word, then, whenever the port is activated, the group of data words stored with the qualified port address will, in almost all cases, contain the instruction which generates or transmits data which is output through the port.

This provides a significant improvement over a logic analyzer which can capture only a single qualified data word. In that case, no other information regarding the qualified word can be acquired. Thus, if the address was qualified, the analyzer would provide no information relative to instruction which called or generated it. On the other hand, with the FIG. 2 embodiment, if the address is qualified, it will be stored together with up to seven words which preceded it; as computer instructions rarely exceed five bus cycles, it is highly likely that qualification of the address will result in capture of its calling or generating instruction. This feature of the invention also improves over logic analyzers having the ability to acquire data groups which follow the qualified word. In those analyzers, should qualification be based on the I/O port address, the stimulating instruction, which would precede the address, would be missed, while, if the addresses of all instructions generating I/O cycles of interest were qualified, an unbounded number of qualified word recognizers would be required to guarantee that the example above could be solved in the most general case.

Finally, in capturing multiple groups of data words, the invention significantly improves over the Tarczy-Hornoch-type logic analyzers which can capture only one qualified data group at a time, and which therefore require that the execution of the system program be halted at each occurrence of the port address, or that the program be executed a number of times, so that the words preceding each occurrence of the address can be analyzed. Thus, the improvement becomes important in cases where the I/O port may be incorrectly activated by more than one procedure or under more than one set of conditions, since the apparatus of the invention can capture all of the incorrect calls with only one continuous execution of the program.

Figure 3:
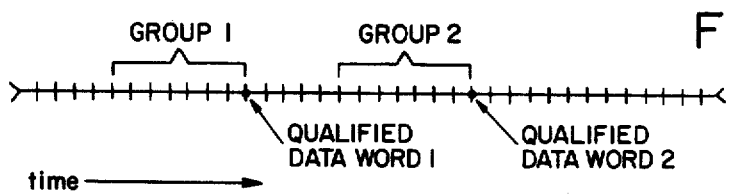
FIG. 3 is a conceptual illustration representing how groups of data words may be acquired from a system under test.

The method of the invention can be understood with reference to FIG. 2 when taken together with FIG. 3, which illustrates the time relationship between the words on the data bus 20, represented by hashmarks. In FIG. 3 time proceeds from left to right. In the method of the invention, a plurality of groups of successive data words, signified by GROUPS 1 and 2, which are present in the data bus 20, may be stored at a plurality of successive data storage locations in the acquisition memory 24. Each of the data storage locations has a storage address determined by the combined outputs of the address MSB counter 26 and the address LSB counter 28. Each of the data word groups will include a qualified data word, explained hereinabove and indicated in FIG. 3 as QUALIFIED DATA WORDS 1 and 2, and will further include not more than a predetermined number of data words, which immediately precede the qualified data word in the bus 20. In the preferred embodiment, the number is seven, although this may be varied without departing from the method or apparatus of the invention.

The method of the invention is implemented by the provision, from the address MSB counter 26, of a predetermined number of most significant bits to form a first portion of each data storage location address. In the preferred embodiment, nine MSB's are provided to form the highest portion of each location address. The lowest portion of the address is formed from a predetermined number of LSB's, three in the preferred embodiment, which are provided by the address LSB counter 28. Thus, each address has the following form:

LSB0-LSB2MSB3-MSB11 with significance increasing from left to right.

Further, the lower portion, LSB0-LSB2, of the address is incremented in synchronism with the presence of a data word in the data bus 20. In the preferred embodiment, the address LSB counter 28 is incremented with each cycle of the master clock of the tested system which signifies the presence of one word. However, in other data bus systems, the counter can be incremented by other signals which signify such presence.

Data words are stored at successive data storage locations determined by the successive incrementation of the address LSB counter 28. Since the counter is configured as a cycling ring counter, as described above, the data words are continuously written into a ring of eight storage locations. Should the ring fill before a qualified word occurs, the counter 28 will reset to its lowest value, and the next word will be written over the word contained in the storage location having the lowest address, and so on, until a qualified word is detected.

When a qualified data word is detected, the qualified data detection circuit provides an acquisition signal which causes the upper portion MSB3–MSB11, of the location address pointer to be incremented, which stores the qualified data word with up to a predetermined number (seven in the preferred embodiment) of data words which preceded it. In addition, the lower portion, LSB0–LSB2, of the address is reset to its lowest value to prepare storing data words at the lowest address of the next ring of eight storage locations.

Figure 4:
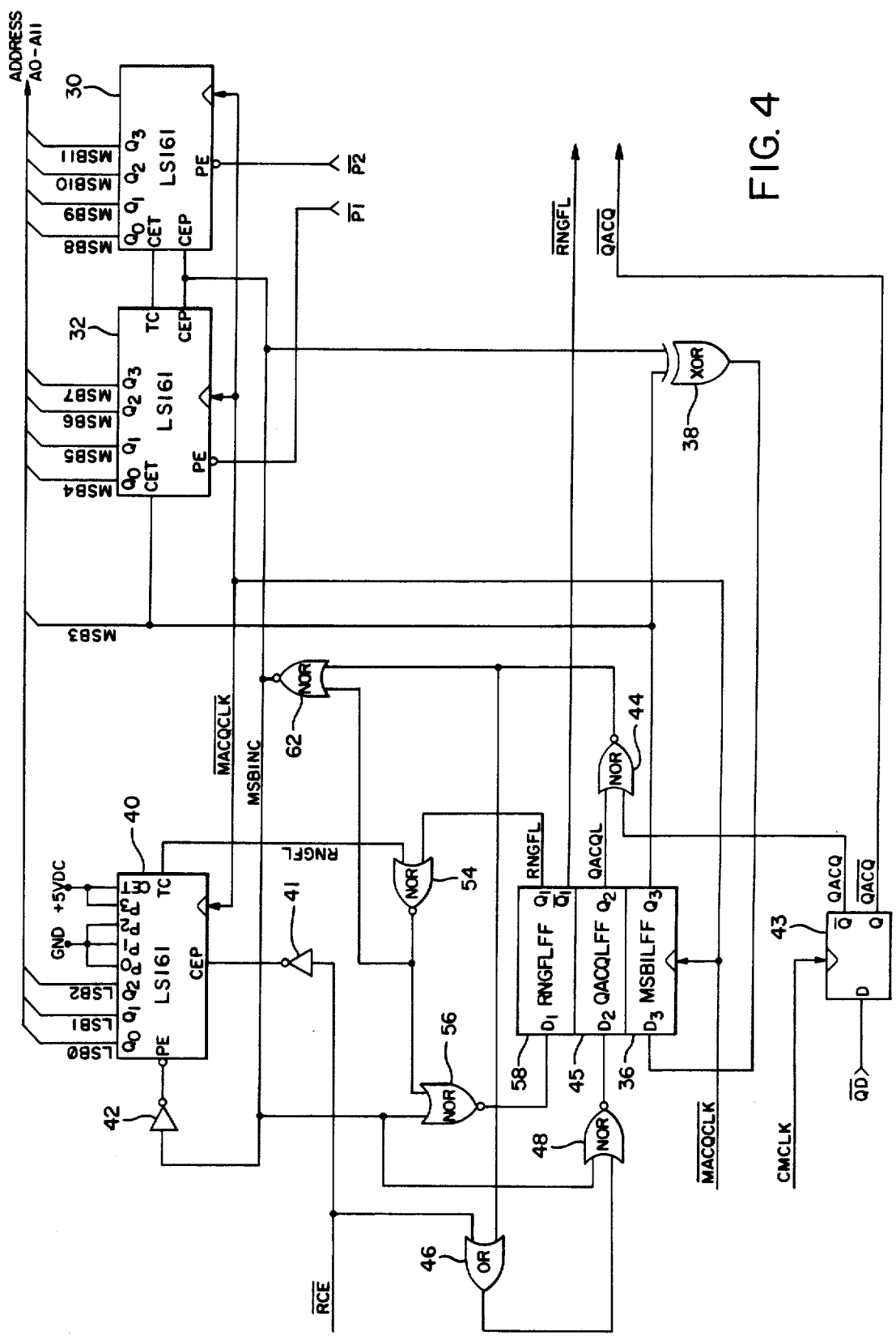
FIG. 4 is a schematic diagram illustrating the addressing circuitry of a second embodiment of the present invention.

A circuit diagram illustrating a portion of a second embodiment of the invention is presented in FIG. 4. In this embodiment, the address MSB's are incremented and the LSB's reset when the ring of addressable storage locations are filled and a qualified data word is detected, rather than only when a qualified data word is detected as in the FIG. 2 embodiment. In the second embodiment, the address LSB and MSB counters of FIG. 2 are augmented by circuitry which detects the concurrence of the qualified acquisition and the filling of the address ring. Otherwise, the second embodiment conforms in all respects to the FIG. 2 apparatus, as explained hereinbelow.

While the FIG. 4 apparatus produces an address pointer signal comprising twelve bits, with the lowest three bits specified as LSB's and the nine remaining high bits specified as MSB's, it is to be understood that an address pointer comprising more or fewer bits can be provided, and that the number of bits designated as LSB's and MSB's may vary to accommodate differing requirements or varying memory sizes.

The address MSB counter of the invention includes a pair of electronic counters 30 and 32 and a flip-flop 36. An exclusive or (XOR) gate 38 is connected to control the $D_3$ input of the MSB flip-flop 36. The lowest MSB, MSB3, is taken from the $Q_3$ output of the MSB flip-flop 36. The next four highest MSB's, MSB4–MSB7, are taken from the $Q_0$–$Q_3$ outputs, respectively, of the counter 32, while the four highest MSB's, MSB8–MSB11, are taken from outputs $Q_0$–$Q_3$, respectively, of the counter 30.

The counters 30 and 32 are connected in series to form an eight bit digital counter with the carry output of the counter 32, available at its TC terminal, provided to the CET enable terminal of the counter 30. The preset terminals, PE, of the counters may be connected to any signal source or sources appropriate to synchronize their operation with any other necessary equipment functions. Both counters are incremented on the rising edge of a $\overline{\text{MACQCLK}}$ signal, when it coincides with an MSBINC (most-significant-bit increment) signal which is input to the CEP enable terminals of counters 30 and 32. (Throughout this description a bar over a signal indicates that the signal is "true" when low.) In addition, the MSB3 signal, available at the $Q_3$ output of the MSB flip-flop 36 is fed to the CET enable terminal of the counter 32.

In operation, the MSB's of the address pointer are incremented whenever the MSBINC signal assumes a logical "high" state. Assuming that all MSB's are initially at a logical "low" state when the MSBINC signal rises, the CET terminals of the counters 30 and 32 will be low, there being no carry from the counter 32 and a low output from the MSB flip-flop 36. However, the low output of the flip-flop 36 enables the MSBINC signal to be passed through XOR gate 38 which will cause the MSB flip-flop 36 to provide a high output from its $Q_3$ terminal at the rising edge of the $\overline{\text{MACQCLK}}$ signal. Thereafter, the MSBINC signal will resume a low state, thereby disabling the counters 30 and 32 by providing a low level at their CEP enable terminals. When the MSBINC signal resumes a low level, the lowest MSB, MSB3, will be latched high by the provision of the $Q_3$ output of the MSB flip-flop 36 through the XOR gate 38 back to the input of the flip-flop.

When the MSBINC signal again goes high, the high levels on the CET and CEP terminals of the counter 32 enable it to increment on the rising edge of the $\overline{\text{MACQCLK}}$ signal. At the same time that the counter 32 increments, the MSBINC signal combines with the high output of the MSB flip-flop 36 to drive the output of the XOR gate 38 low, which causes the $Q_3$ output of the MSB flip-flop 36 to assume a low state on the same rising edge of the $\overline{\text{MACQCLK}}$ signal that causes the counter 32 to increment.

Since, as is explained hereinbelow, the MSBINC signal rises each time a qualified data word occurs and at least seven data words have been stored in the acquisition memory 24, it will be evident that the address MSB counter will increment the address pointer MSB's each time that these two conditions coincide.

The LSB pointer counter 40 provides the three least significant bits, LSB0–LSB2, from its outputs, $Q_0$–$Q_2$, respectively. The counter 40 is configured as a continuously cycling, eight state ring counter which is incremented on the positive edge of the $\overline{\text{MACQCLK}}$ signal. Since, as is explained hereinbelow, the $\overline{\text{MACQCLK}}$ signal is derived from the master clock signal of the system under test, it will be evident that the LSB counter 40 is incremented in synchronism with the frequency of word transfer on the data bus of the system under test. The LSB counter 40 is enabled to count by an $\overline{\text{RCE}}$ (ring count enable) signal which is fed to the CEP terminal of the counter through an inverter 41. The source of the $\overline{\text{RCE}}$ signal can comprise, for example, a logic analyzer front panel switch which is activated by a user to enable the apparatus of the invention to acquire data word groups. The CET terminal of the counter 40 is held high when it is in the ring count mode; this is represented by tying a +5 V source to the terminal. When the MSBINC signal raises, it is fed through the inverter 42 to the PE (preset enable) terminal of the counter, causing it to be preset to provide digital zeros from the outputs $Q_0$–$Q_2$. The carry output of the LSB counter 40, available at the TC terminal, raises to a high level when the highest state of the counter is reached. The first time that this signal is raised, eight words will have been written into eight consecutive spaces in the sector of the acquisition memory 24 which is established by the MSB's of the address pointer as described above. The positive output from the TC terminal indicates that the ring of address locations is full, and the signal is designated as RNGF (ring full).

Once the RNGF signal is raised for the first time, it is captured by a latch circuit comprising the NOR gate 54, the NOR gate 56, and the RNGFL (RNGF latch) flip-flop 58. Initially, before the ring of address locations has been filled, the $Q_1$ output of the flip-flop, which is fed to the input of the NOR gate 54, is low. When the RNGF signal raises, the output of the NOR gate 54 will go low and will be passed through the NOR gate 56 as a high signal, assuming that the MSBINC signal is low. The output of the gate 56 is fed to the $D_1$ input of the RNGFL flip-flop 58 and, when it raises, the $Q_1$ output of the flip-flop will also rise with a positive edge of the $\overline{\text{MACQCLK}}$ signal. In addition, the $\overline{Q_1}$ output of the RNGFL flip-flop 58 goes low which provides a signal $\overline{\text{RNGFL}}$ indicating that the ring of address locations has been filled.

A qualified data detection circuit, not shown in FIG. 4, but equivalent to the circuit 22 of FIG. 2, detects the presence of qualified word on a data bus (which is equivalent to the bus 20 of FIG. 2) and provides a signal $\overline{\text{QD}}$ which indicates detection of a qualified word. This signal is fed into the D input of flip-flop 43 which will assume a corresponding state on the first coincident rising edge of a CMCLK signal. The Q output of the flip-flop 43 provides a $\overline{\text{QACQ}}$ signal which tracks the $\overline{\text{QD}}$ signal in indicating the presence or absence of qualified data word on the data bus. The $\overline{Q}$ output of the flip-flop provides the reciprocal of the $\overline{\text{QACA}}$ signal (QACQ) which is presented to one input terminal of the NOR gate 44. Assuming that the $Q_2$ output of the QACQL (QACQ latch) flip-flop 45 is low, when the QACQ signal rises, indicating the presence of a qualified data word, the output of the NOR gate 44 will fall and will be combined at the input of the OR gate 46 with the $\overline{\text{RCE}}$ signal which will also be low when the counter 40 is enabled. The two low inputs at the input of the gate 46 which will cause its output to fall. The low output of the gate 46 is fed to one input of the NOR gate 48 where it is combined with the MSBINC signal which is present at the second inverting input to the gate. Assuming that the MSBINC signal is low, the two low inputs will result in a high output from NOR gate 48 which is presented to the $D_2$ input of the QACQL flip-flop 45 at the next rising edge of the $\overline{\text{MACQCLK}}$ signal, the flip-flop's $Q_2$ output will rise. The QACQL flip-flop 45 will be latched in a high state by the latching feedback path which extends from its $Q_2$ output through the NOR gate 44, the OR gate 46, and the NOR gate 48. This latch and the latch described hereinabove for the flip-flop 58 will cause flip-flops 45 and 58 to be set low whenever the outputs of those flip-flops are high and the MSBINC signal rises to its high level.

The MSBINC signal indicates the concurrence of two events: the filling of the eight currently available storage locations; and the occurrence of one or more qualified data words in those locations. This concurrence is detected by the NOR gate 62. One of the gate inputs is from the output of the NOR gate 44; the other is taken from the output of the NOR gate 54 which is derived from the output of the RNGFL flip-flop 58 and the RNGF signal output by the LSB counter 40.

The phasing of the MSBINC signal with the other control signals of the FIG. 4 circuit can be understood with reference to the waveforms illustrated in FIG. 5. A MCLK clock waveform is derived from the master clock of the system under test, which, as is stated hereinabove is synchronous with the occurrence of data words on the system data bus. In practice, the logic analyzer of which the apparatus of the invention forms a part has clock circuitry which derives the MCLK signal and delays it slightly from the system clock in order to give the control signals of the FIG. 4 circuit time to respond to the occurrence of qualified word. Clock derivation circuits having such a delay capability are well known in the art and will not be described in detail here. Three other clock signals are derived by the same circuitry from the MCLK clock signal and are shown in FIG. 5 as CMCLK, which comprises a positive-going narrow pulse occurring at every positive-going edge of the MCLK signal, and $\overline{\text{MACQCLK}}$ and $\overline{\text{ACQE}}$ which consist of a relatively narrow negative-going pulse occurring at every positive-going edge of the MCLK signal. In the embodiments of the invention, the $\overline{\text{MACQCLK}}$ and $\overline{\text{ACQE}}$ signals are the inverse of the CMCLK signal and provide a positive-going pulse edge which is delayed relative to the positive-going pulse edge of the CMCLK signal.

In operation, when the ring of storage locations has been filled the first time before a qualified data word has been detected, the carry output from the counter 40 will have set the RNGFL signal of FIG. 5 high at transition 70 where it will be latched as described hereinabove until the MSBINC circuit rises to a positive value. When a qualified data word is detected, the QACQ signal will go high on the positive edge 72 of the CMCLK signal as indicated by pulse edge 73 of the QACQ waveform. This transition of the QACQ signal will be combined by the NOR gate 62 with the positive RNGFL signal to cause a positive transition 74 in the MSBINC waveform. With MSBINC high, the output of the NOR gate 56 will be driven low causing the RNGFL flip-flop 58 to transition on the positive edge 76 of the $\overline{\text{MACQCLK}}$ signal, which will cause the RNGFL signal to transition to a low state, as indicated by negative-going edge 77 of the waveform in FIG. 5. The negative transition 77 of the RNGFL signal is inverted by the NOR gate 54 and drives the MSBINC signal negative as indicated by transition 78.

In a case where a qualified word has occurred before the ring of storage locations has been filled, the occurrence will have been marked by the latching of the QACQ signal in QACQL flip-flop 45, which is indicated by positive level 80 of the QACQL signal in FIG. 5. When the ring of storage locations is filled, indicated by the RNGF signal, not shown, which is available from the carry output of the counter 40 and which rises with the rising edge 82 of the $\overline{\text{MACQCLK}}$ signal, the MSBINC signal rises at transition 81 and remains high until QACQL falls (transition 83) at the positive-going edge 84 of $\overline{\text{MACQCLK}}$. This prevents the setting of the RNGFL flip-flop 58.

Finally, in a case where the last of the first eight words written into the ring of storage addresses is a qualified word, the QACQ signal will make the transition 85 to a high state upon the positive transition 86 of the CMCLK signal. Due to the immediately previous positive transition of the $\overline{\text{MACQCLK}}$ signal, the RNGF output from the terminal TC of the counter 40 is high. With the inverted QACQ and RNGF signals present at the input of the NOR gate 62, the MSBINC signal will rise (transition 88) and stay high until the rising edge 87 of the MACQCLK signal. The positive level of the MSBINC signal will prevent either QACQL flip-flop 45 or RNGFL flip-flop 58 from latching positive.

Figure 6:
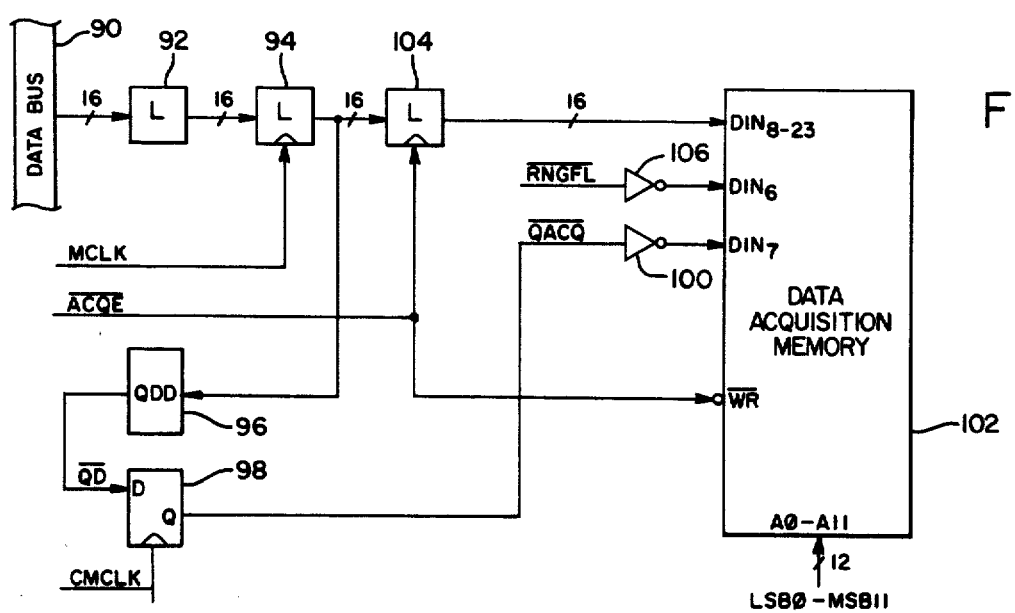
FIG. 6 is a schematic diagram illustrating, in greater detail, the data storage memory of both embodiments of the present invention, together with its associated interface circuitry.

FIG. 6 illustrates how the circuitry of FIGS. 2 and 4 and the clock signals of FIG. 5 operate to enter data words into the acquisition memory in the mode described hereinabove. In FIG. 6 there is illustrated a data bus 90 from which 16 parallel signal paths provide a path to conduct the data word currently on the data bus through the transparent latch 92 into a latch circuit 94 which operates in synchronism with the MCLK signal. The data word held in the latch 94 is inspected by the qualified data detection (QDD) circuit 96, which is equivalent to the corresponding circuit in FIG. 2. The detection circuit 96 provides a $\overline{\text{QD}}$ signal to the flip-flop 98 (which corresponds to the flip-flop 43 of FIG. 4) which, in turn, provides the $\overline{\text{QACQ}}$ signal described above. The $\overline{\text{QACQ}}$ signal is fed through the inverter 100 to data input terminal $D_{in7}$ of a data acquisition memory 102, which is the equivalent of the acquisition memory 24 in FIG. 2.

Turning once more to the movement of the data word toward the memory, the word held in latch circuit 94 is entered into the latch circuit 104 on the first positive edge of the $\overline{\text{ACQE}}$ signal following the entry of the word into the latch 94. At the same time that the word is being entered into the latch circuit 104, the word previously entered thereinto is transferred into the data acquisition memory 102 through the data input terminals $D_{in8-23}$ on the same positive edge of the $\overline{\text{ACQE}}$ signal which enters the next data word into the latch 104, this being accomplished by provision of the $\overline{\text{ACQE}}$ signal to the write-enable ($\overline{\text{WR}}$) terminal of the data acquisition memory. The RNGFL signal provided by the $\overline{Q}_1$ output of the RNGFL flip-flop 58 of FIG. 4 is fed through inverter 106 (thereby converting it to the positive RNGFL signal) to the data input $D_{in6}$ of the memory.

The current memory address is established at terminals $A_0-A_{11}$ of the acquisition memory, with the inputs to terminal $A_0-A_2$ being provided by the $LSB_0-LSB_2$ outputs, respectively, of the LSB counter 40 and the inputs to terminals $A_3-A_{11}$ being provided by the MSB3-MSB11 outputs, respectively, of the address MSB counter illustrated in FIG. 4.

In either embodiment of the invention, each storage location for the data acquisition memory 102, is accessed by a separate address and comprises a 24-bit-wide word, the most significant 16 bits of which comprise a data word captured from the data bus 90. Of the least significant eight bits of a memory word, bits 6 and 7 comprise the states of the RNGFL and QACQ signals, respectively, at the time that the data word was entered into the memory. The remaining bits, 5–0, are reserved for information unrelated to this invention. This provides a way of interpreting the data word groups which have been captured from the data bus 90 so that they may be removed from memory in the order in which they occurred on the bus. This is shown in FIG. 7.

In FIG. 7, the column headed "Data In Storage" represents the 24-bit-wide data words which have been entered into storage memory locations having addresses indicated in the column headed "Address." In a first group (Group 1) of eight words stored in memory, which extend from memory address 0 through memory address 7, the words stored at memory addresses 2 and 5 are evidently qualified words, as is evidenced by the "1" contained in bit position 7 of each word (which indicates the status of the QACQ signal at the time the words were entered). In addition, bit position 6 of each word is "0," indicating that the ring of storage locations was not full when either qualified word was captured. In this group, the MSBINC signal would have been raised when storage address location 7 was filled, which would increment the MSB counter and reset the LSB counter for the next group of eight storage locations. Thus, the words at storage address locations 0–7 are in the order in which they occurred in the databus and can be removed from the data acquisition memory in that order as is indicated in the column headed "Storage Data Rearranged."

The words of Group 2 contained in the storage address locations 10-17 are stored in the order indicated to the left of the column headed "Data In Storage." In this example, the ring of storage address locations was full before the time the qualified data word, stored at address location 13, was detected, as is indicated by the "1" in bit position 6 of that word. Since the words were written sequentially into memory beginning with address location 10, ending with address location 17, and beginning again at 10, and since the qualified data word ended the cycle and caused the address MSB's to increment by one to establish the next ring of eight address locations, the eight words can be rearranged with the qualified word put last and the other words arranged above it in an order, which is the reverse of the order in which the ring address locations are incremented. The data words are reordered as shown to the right of the "address" column with the qualified word placed last, the word in the next lowest address location placed immediately before it and so on, with the word in the address location immediately succeeding that of the qualified word placed into the lowest storage location. This represents the actual order in which the words occurred on the bus.

Finally, the third group of words stored in address locations 20-27 illustrates the case where the storage address ring is filled by the word immediately preceeding the qualified word. The data words are rearranged with the qualified word last and the stored data words rearranged in an order corresponding to their occurrence on the bus. This is accomplished by reassigning the qualified word to memory location 27, the next most recent word to memory location 26, and so on, as illustrated.

It is evident that the circuit illustrated in FIG. 4 may be altered to conform to the operation of the embodiment of FIG. 2 by not using the RNGFL and QACQL flip-flops 58 and 45 together with their associated latching gates, 54, 56, 44, 46 and 48, and gate 62, which detects the coincidence of a full storage ring and a qualified data signal for the purpose of determining the point at which to increment the acquisition signal. In this case, the QACQ signal would replace the MSBINC signal at the PE input to LSB counter 40, at the MSBINC input to XOR gate 38, and at the CEP terminals of the MSB counters 30 and 32. Then, when a qualified word is detected, the address LSB's will be reset to 0, and the MSB's incremented by 1.

With this alteration to the FIG. 4 circuit, it will be the case that, when a qualified word is preceded by seven or more data words, the ring of storage locations will be filled, and thus fully utilized. However, should fewer than seven words occur between two qualified words, or between the beginning of a program and the first qualified word, the ring will not be filled before the address MSB's are incremented, resulting in a less than full utilization of the data acquisition memory. For example, if the group of words stored in locations 0-7 in FIG. 7 were to be acquired by the altered FIG. 4 circuit, the word at address 2 would be followed by five empty storage locations. The word at location 5 would be located at address 12, preceded by the two words between it and the prior qualified word at locations 10 and 11, and followed by five empty locations. Groups 2 and 3 would be stored in locations 20-27 and 30-37, respectively. In any case, this circuit would cause a qualified word to be stored together with a number of preceding words, the number ranging from zero to seven in this embodiment but being determined, in the general case, by the number of states of the LSB counter.

Although the apparatus and method of the invention have been described hereinabove as being used to acquire signals from the data bus of a computer system under test, it is to be further understood that such terms are not intended to be limiting. Thus, the apparatus and method may be used in the acquisition of signals from any one or combination of system circuits which include address, data, and control busses, their associated circuits, the system computer, or any equivalent electronic circuitry. Moreover, it should be evident that, generally, they may be used in the testing of a wide variety of synchronous logic systems which may or may not include computers.

Although a variety of different devices might be utilized to implement the circuitry disclosed herein, or variations thereof, some specific devices which will work in the afore-described preferred embodiment are listed in Table 1 hereof.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

TABLE 1

| Item Numbers | Description | Source/Nomenclature |
|---|---|---|
| 30, 32, 40 | Synchronous 4-bit counter | 74LS161A |
| 36, 45, 58 | Quad D-type, edge-triggered flip-flop | 74LS175 |
| 43 | Dual D-type, edge-triggered flip-flop | 74F74 |
| 92 | Octal transparent latches | 74F373 |
| 94 | Octal D-type edge-triggered flip-flops | 74F374 |
| 104 | Octal D-type edge-triggered flip-flops | 74LS374 |
| 102 | Six parallel 4K × 4 random access memories | IMS1420-55 |

What is claimed is:

1. An apparatus for acquiring data words which are present on synchronous logic circuitry of a system under test, comprising:
   (a) detecting means coupled to said data bus for producing an acquisition signal indicative of the occurrence of at least one particular data word on said logic circuitry;
   (b) data storage means having a plurality of storage locations and addresses corresponding with said locations, said data storage means coupled to said data bus for storing a plurality of successive data words; and
   (c) addressing means, responsive to said acquisition signal and to the presence of data words on said data bus, for producing the storage addresses of said successive data words in said data storage means such that a predetermined number of successive data words preceding each said particular data word on said logic circuitry are stored in locations in said data storage means corresponding to said storage addresses.

2. The apparatus of claim 1 wherein said logic circuitry operates in synchronism with a clock signal and said addressing means responds to said acquisition signal and said clock signal for producing said storage addresses.

3. The apparatus of claim 1 wherein said addressing means comprises:
   (a) a first counting means responsive to said acquisition signal, for producing a first signal representative of a predetermined number of most significant bits of each said storage address; and
   (b) a second counting means, responsive to the presence of said data words, for producing a second pointer signal representative of a predetermined number of least significant bits of each said storage address.

4. The apparatus of claim 3 wherein said logic circuitry operates in synchronism with a clock signal and said second counting means is responsive to said clock signal.

5. The apparatus of claim 1 further including means responsive to said acquisition signal and to the presence of said data words on said logic circuitry for producing location data indicative of the order of occurrence of said stored data signals on said logic circuitry, and wherein said data storage means includes means for associating and storing said location data with said stored data words.

6. The apparatus of claim 1 wherein said addressing means is further responsive to a signal representing the number of data words stored in said data storage means such that a respective number of successive data words are stored together with said qualified data word in said data storage locations.

7. The apparatus of claim 6 wherein said addressing means comprises:
   (a) a first counting means responsive to said acquisition signal and to the number of said stored data words for producing a first signal representative of a predetermined number of most significant bits of each storage address; and
   (b) a second counting means responsive to the presence of said data words for producing a second signal representative of a predetermined number of least significant bits of each said storage address.

8. The apparatus of claim 7 wherein said logic circuitry operates in synchronism with a clock signal and said second counting means is responsive to said clock signal.

9. A method of selectively storing, in a plurality of successive storage locations contained in a data storage device, a plurality of groups of successive data words which are present on logic circuitry of a system under test, each said group comprising at least one particular data word and no more than a predetermined number of data words which precede said particular data word on said logic circuitry, each said storage location having a storage address, said method comprising the steps of:
   (a) providing predetermined most significant bits to form a first portion of each said address;
   (b) providing a predetermined number of least significant bits to form a second portion of each said address;
   (c) changing the value of said second portion in response to the presence of said data words on said data bus;
   (d) storing successive data words at storage locations having addresses determined according to (a), (b), and (c); and
   (e) changing the value of said first portion in response to the presence of said particular data word on said data bus.

10. The method of claim 9 wherein steps (a)–(e) are performed repetitively.

11. The method of claim 9 wherein said logic circuitry operates in synchronism with a clock signal and wherein the step of changing the value of said second portion is performed in response to said clock signal.

12. The method of claim 9 further including the steps of:
   (f) providing location data indicative of the order of occurrence of said stored 10 data signals on logic circuitry; and
   (g) storing said location data with said stored data words.

13. The method of claim 9 wherein step (e) comprises changing the value of said first portion in response to the presence of said qualified data word and to the storage of a respective number of data words according to step (d).

14. The method of claim 12 wherein steps (a)–(e) are performed repetitively.

15. A logic analyzer including an apparatus for acquiring data words which are present on logic circuitry of an electronic system undergoing test, said apparatus comprising:
   (a) detecting means coupled to said logic circuitry for producing an acquisition signal indicative of the occurrence of at least one particular data word on said data bus;
   (b) data storage means having a plurality of storage locations and addresses corresponding with said locations, said data storage means coupled to said data bus for storing a plurality of successive data words; and
   (c) addressing means, responsive to said acquisition signal and to the presence of data words on said logic circuitry, for producing the storage addresses of said successive data words in said data storage means such that a predetermined number of successive data words preceding each said particular data word on said data bus are stored in locations in said data storage means corresponding to said storage addresses.

16. The apparatus of claim 14 wherein said addressing means is further responsive to a signal representing the number of data words stored in said data storage means such that a respective number of successive data words are stored together with said qualified data word in said data storage locations.

* * * * *

UNITED STATES PATENT AND TRADEMARK OFFICE
CERTIFICATE OF CORRECTION

PATENT NO. : 4,513,395
DATED : April 23, 1985
INVENTOR(S) : Michael D. Henry et al Page 1 of 2

It is certified that error appears in the above-identified patent and that said Letters Patent is hereby corrected as shown below:

| | | |
|---|---|---|
| In the Abstract, | line 5, | after "number of" insert --unqualified-- |
| | line 6, | after "have" insert --immediately-- |
| Col. 1, | line 61, | after "previous," delete "the" |
| Col. 3, | line 2, | change "function" to --functions-- |
| | line 3, | after "producing" insert --a-- |
| Col. 8, | line 11, | after "prepare" insert --for-- |
| Col. 10, | line 65, | before "qualified" insert --a--. |

UNITED STATES PATENT AND TRADEMARK OFFICE
CERTIFICATE OF CORRECTION

PATENT NO. : 4,513,395
DATED : April 23, 1985
INVENTOR(S) : Michael D. Henry et al Page 2 of 2

It is certified that error appears in the above-identified patent and that said Letters Patent is hereby corrected as shown below:

Col. 12,    line 6,    change "$D_{in7}$" to --$DIN_7$-- line 17,    change "$D_{in8-23}$" to --$DIN_{8-23}$-- line 24,    change "$D_{in6}$" to --$DIN_6$--

Col. 15,    line 11,    after "first" insert --pointer--

Col. 16,    line 24,    change "10 data signals on" to --data words on said--

Signed and Sealed this

Eleventh Day of November, 1986

*Attest:*

DONALD J. QUIGG

*Attesting Officer*      *Commissioner of Patents and Trademarks*